United States Patent
Bao et al.

(10) Patent No.: US 10,892,339 B2
(45) Date of Patent: Jan. 12, 2021

(54) GATE FIRST TECHNIQUE IN VERTICAL TRANSPORT FET USING DOPED SILICON GATES WITH SILICIDE

(71) Applicant: INTERNATIONAL BUSINESS MACHINES CORPORATION, Armonk, NY (US)

(72) Inventors: Ruqiang Bao, Niskayuna, NY (US); Hemanth Jagannathan, Niskayuna, NY (US); Paul Charles Jamison, Hopewell Junction, NY (US); Choonghyun Lee, Rensselaer, NY (US); Sanjay C. Mehta, Niskayuna, NY (US); Vijay Narayanan, New York, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/351,729

(22) Filed: Mar. 13, 2019

(65) Prior Publication Data
US 2020/0295147 A1 Sep. 17, 2020

(51) Int. Cl.
| | |
|---|---|
| H01L 29/417 | (2006.01) |
| H01L 29/423 | (2006.01) |
| H01L 29/66 | (2006.01) |
| H01L 29/78 | (2006.01) |
| H01L 29/778 | (2006.01) |

(52) U.S. Cl.
CPC .. H01L 29/41791 (2013.01); H01L 29/42356 (2013.01); H01L 29/66666 (2013.01); H01L 29/66795 (2013.01); H01L 29/7788 (2013.01); H01L 29/785 (2013.01); H01L 2029/7858 (2013.01)

(58) Field of Classification Search
CPC ......... H01L 29/41791; H01L 29/66795; H01L 29/7788; H01L 29/42356; H01L 29/785; H01L 29/66666; H01L 28/7858
USPC ....... 257/329, 330, 332, 334, 335, 351, 401, 257/48, E21.403, E21.633, E21.643, 257/E29.004, E29.085, E29.245, E29.262, 257/E29.274; 438/590, 478, 153, 213
See application file for complete search history.

(56) References Cited

U.S. PATENT DOCUMENTS

| | | | |
|---|---|---|---|
| 7,446,025 B2 | 11/2008 | Cohen et al. | |
| 7,683,428 B2 | 3/2010 | Chidambarrao et al. | |
| 8,883,594 B2 | 11/2014 | Chuang et al. | |
| 9,299,835 B1 | 3/2016 | Anderson et al. | |
| 9,640,667 B1* | 5/2017 | Balakrishnan | .... H01L 29/42392 |
| 9,773,913 B1* | 9/2017 | Balakrishnan | .... H01L 29/78618 |
| 9,876,015 B1* | 1/2018 | Balakrishnan | ........ H01L 27/092 |
| 9,934,977 B1 | 4/2018 | Adusumilli et al. | |
| 2011/0188288 A1* | 8/2011 | Minami | ................ G11C 11/22 365/145 |
| 2013/0240983 A1 | 9/2013 | Larrieu | |
| 2015/0372149 A1 | 12/2015 | Colinge et al. | |
| 2016/0293756 A1* | 10/2016 | Liu | ..................... H01L 29/7391 |
| 2017/0345829 A1* | 11/2017 | Balakrishnan | .... H01L 29/78696 |

(Continued)

*Primary Examiner* — Dao H Nguyen
(74) *Attorney, Agent, or Firm* — Cantor Colburn LLP; Anthony Curro

(57) ABSTRACT

A technique relates to a semiconductor device. A gate stack is formed on a fin, the gate stack being formed to have a length in a vertical direction. A gate contact is formed adjacent to the gate stack for the length of the gate stack in the vertical direction.

20 Claims, 16 Drawing Sheets

(56) References Cited

U.S. PATENT DOCUMENTS

2017/0365713 A1* 12/2017 Cheng ............... H01L 29/66553
2019/0157161 A1* 5/2019 Balakrishnan ...... H01L 29/1066
2019/0326165 A1* 10/2019 Xie ................... H01L 21/76816

* cited by examiner

GATE FIRST TECHNIQUE IN VERTICAL TRANSPORT FET USING DOPED SILICON GATES WITH SILICIDE

BACKGROUND

The present invention generally relates to fabrication methods and resulting structures for semiconductor devices, and more specifically, to a gate first technique in vertical transport FETs using doped silicon gates (e.g., polysilicon, amorphous silicon, etc.) with silicide.

A metal-oxide-semiconductor field-effect transistor (MOSFET) is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on"). A fin type field effect transistor (FET) is a type of nonplanar MOSFET. FinFET devices include an arrangement of fins disposed on a substrate. The fins are formed from a semiconductor material. A gate stack is arranged over the fins and defines a channel region of the fins, while regions of the fins extending outwardly from the channel region define active source and drain regions of the device. Various state-of-the-art techniques can be used for forming the fin.

Another nonplanar MOSFET that uses fin-shaped structures is a vertical FET. A vertical FET operates like a normal finFET that is horizontal. However, in a vertical FET, the entire fin functions as the channel, and the source and drain regions are positioned at respective ends of the vertically positioned fin such that the current runs vertically from source to drain. Also, the gate of a vertical FET usually wraps around the fin-shaped channel.

SUMMARY

Embodiments of the invention are directed to a method for forming a semiconductor device. A non-limiting example of the method includes forming a gate stack on a fin, the gate stack being formed to have a length in a vertical direction. Also, the method includes forming a gate contact adjacent to the gate stack for the length of the gate stack in the vertical direction.

Embodiments of the invention are directed to a semiconductor device. A non-limiting example of the semiconductor device includes a gate stack formed on a fin, the gate stack being formed to have a length in a vertical direction. The semiconductor device includes a gate contact formed adjacent to the gate stack for the length of the gate stack in the vertical direction.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
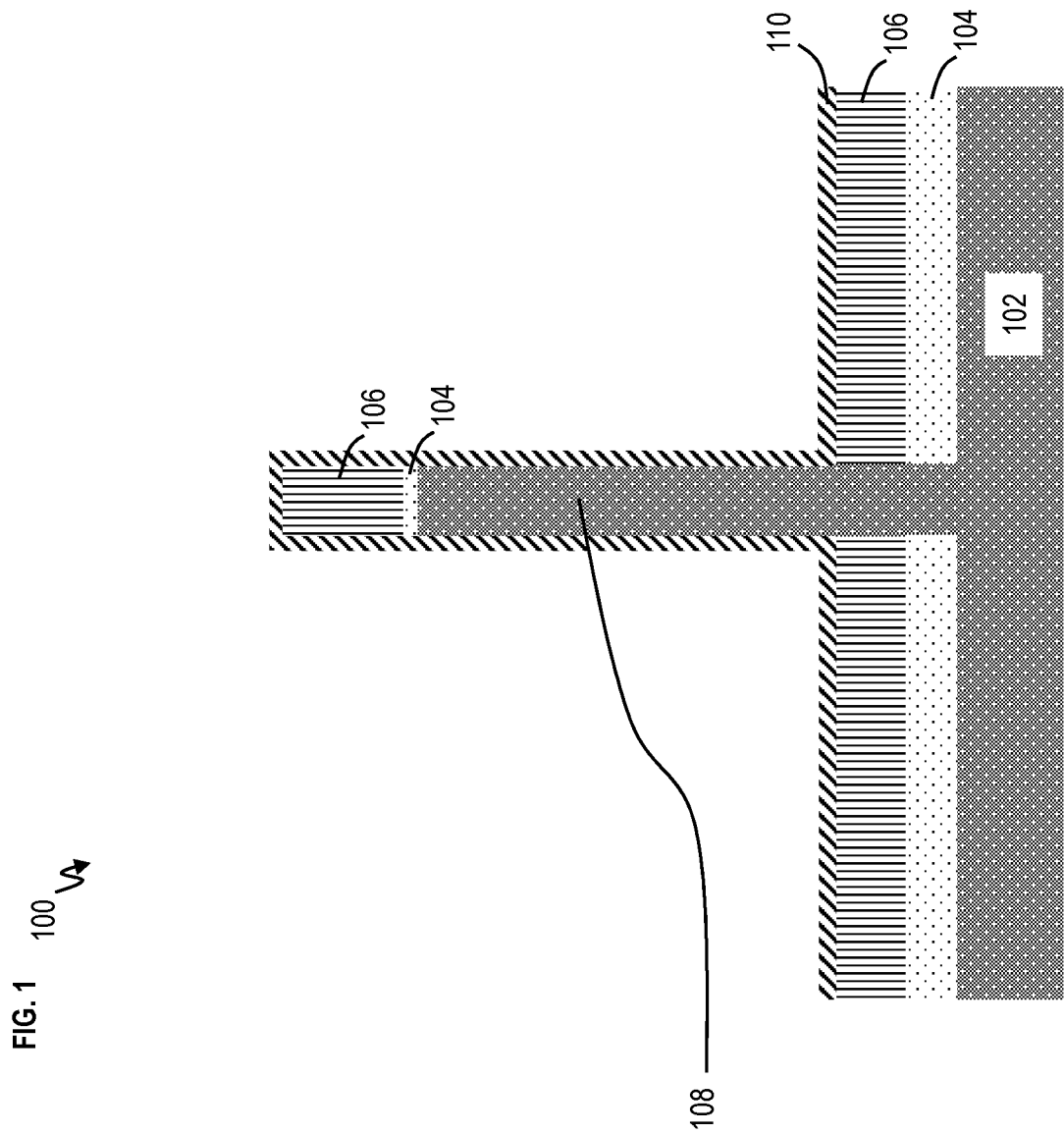
FIG. 1 depicts a cross-sectional view of the semiconductor device after an initial set of fabrication operations according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, state-of-the-art device scaling has reached an impasse as scaling has decreased (at 7 nanometer (nm) node). Technology node (also process node, process technology or simply node) refers to a specific semiconductor manufacturing process and its design rules. The scaling has caused increased contact resistance as a result of shrinking contact area.

Turning now to an overview of aspects of the invention, one or more embodiments of the invention provide vertical transport (VT) field effect transistor (FET) devices which overcome this limitation of increased contact resistance by enabling large gate contact surface area. For example, the gate contact can be formed along the (entire) vertical gate length of the gate. Described herein is a gate first integration approach as applied to the vertical transport FET devices. The gate last approach in vertical transport FET flow involves significant integration challenges which include metal gate patterning that has to be anisotropic and selective to surrounding dielectric films. However, the gate first approach presented herein uses doped polysilicon (polysilicon) or amorphous silicon as the gate material according to embodiments of the invention. The patterning of polysilicon (and/or amorphous) is very well-established, which simplifies integration of gate stack.

Turning now to a more detailed description of aspects of the present invention, FIG. 1 depicts a cross-sectional view of a semiconductor device 100 according to embodiments of the invention. The semiconductor device 100 is a vertical transport field effect transistor. After initial fabrication processing, the semiconductor device 100 includes fins 108 formed on substrate 102. The fins 108 can be formed using standard lithography processing including sidewall transfer, mandrels, etc. Example materials of the substrate 102 can include silicon (Si), silicon germanium (SiGe), III-V semiconductors, etc. In some implementations, the fins 108 can be the same material as the substrate 102. Also, a portion or portions of the fins 108 can be doped as desired. Although a single fin 108 is illustrated for explanation purposes, it should be appreciated that the description applies to and represents numerous fins 108 being concurrently fabricated as understood by one skilled in the art. A bottom plate 104 is deposited on top of the substrate 102. The bottom plate 104 is to serve as the bottom source/drain (S/D) for the vertical transistor. The bottom plate 104 can be a planar silicon plate. The bottom plate 104 can become the bottom S/D by ion implantation with n-type dopants (such as As, P, etc.) to from n-type FET (NFET) devices and p-type dopants (such as B) to form p-type FET (PFET) devices. Additionally, the bottom S/D regions can be formed by growing the bottom plate 104 as an epitaxial layer. The epitaxial material can be selectively doped with p-type dopants for PFET S/D such as SiGe doped with B and with n-type dopants such as Si doped with P. The p and n regions are separated by shallow trench isolation (STI) regions (not shown) which involves oxide deposition, planarization, and recessing slightly below the bottom S/D plate region. After defining the bottom plate 104 (e.g., bottom S/D region), a bottom spacer 106 is formed using directional deposition techniques such as high density plasma deposition (HDP), radio frequency (RF) physical vapor deposition (PVD), etc. Examples of the bottom spacer material for bottom spacer 106 can include more conventional nitride-based materials such as silicon nitride (SiN), or a lower k version of the material such as SiOCN, SiOC, SiBCN with dielectric constant ranging from k=3.9-5.5.

After bottom spacer formation, a high-k layer 110 is formed. Examples of high-k materials include, but are not limited to, metal oxides such as hafnium oxide, hafnium silicon oxide, hafnium silicon oxynitride, lanthanum oxide, zirconium hafnium silicate, hafnium aluminosilicate, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include a dopant such as lanthanum or aluminum. High-k dielectric materials can have a dielectric constant greater than 3.9, 7.0, or 10.0.

Figure 2:
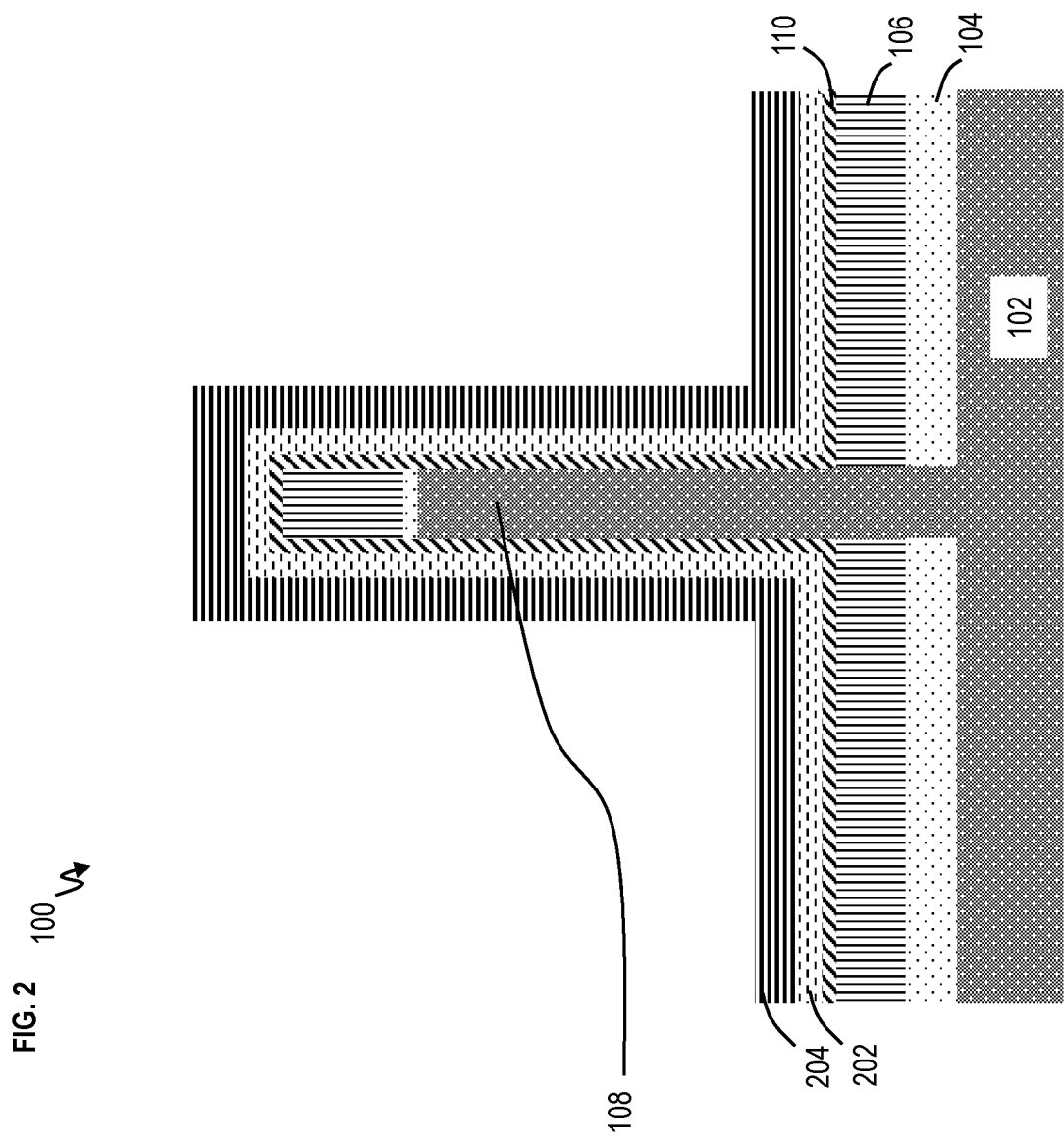
FIG. 2 depicts a cross-sectional view of the semiconductor device after fabrication operations according to embodiments of the invention.

FIG. 2 depicts a cross-sectional view of the semiconductor device 100 after fabrication operations according to embodiments of the invention. Reliability caps 202 and 204 can be deposited on the semiconductor device 100. The reliability cap 202, for example, can be titanium nitride (TiN). The reliability cap 202 can have a thickness of about 15 angstroms (Å). The reliability cap 204 can be silicon, and other example materials include SiN or SiC Such material should be a good oxygen diffusion barrier during reliability anneal, thereby preventing channel Si oxidation, which would cause increase in the electrically measured gate oxide thickness ($T_{inv}$). The reliability cap 204 can have a thickness of about 30 Å. A high temperature anneal, such as rapid thermal anneal (RTA), is performed to improve the reliability of the high-k layer 110 underneath the reliability caps 202 and 204.

Figure 3:
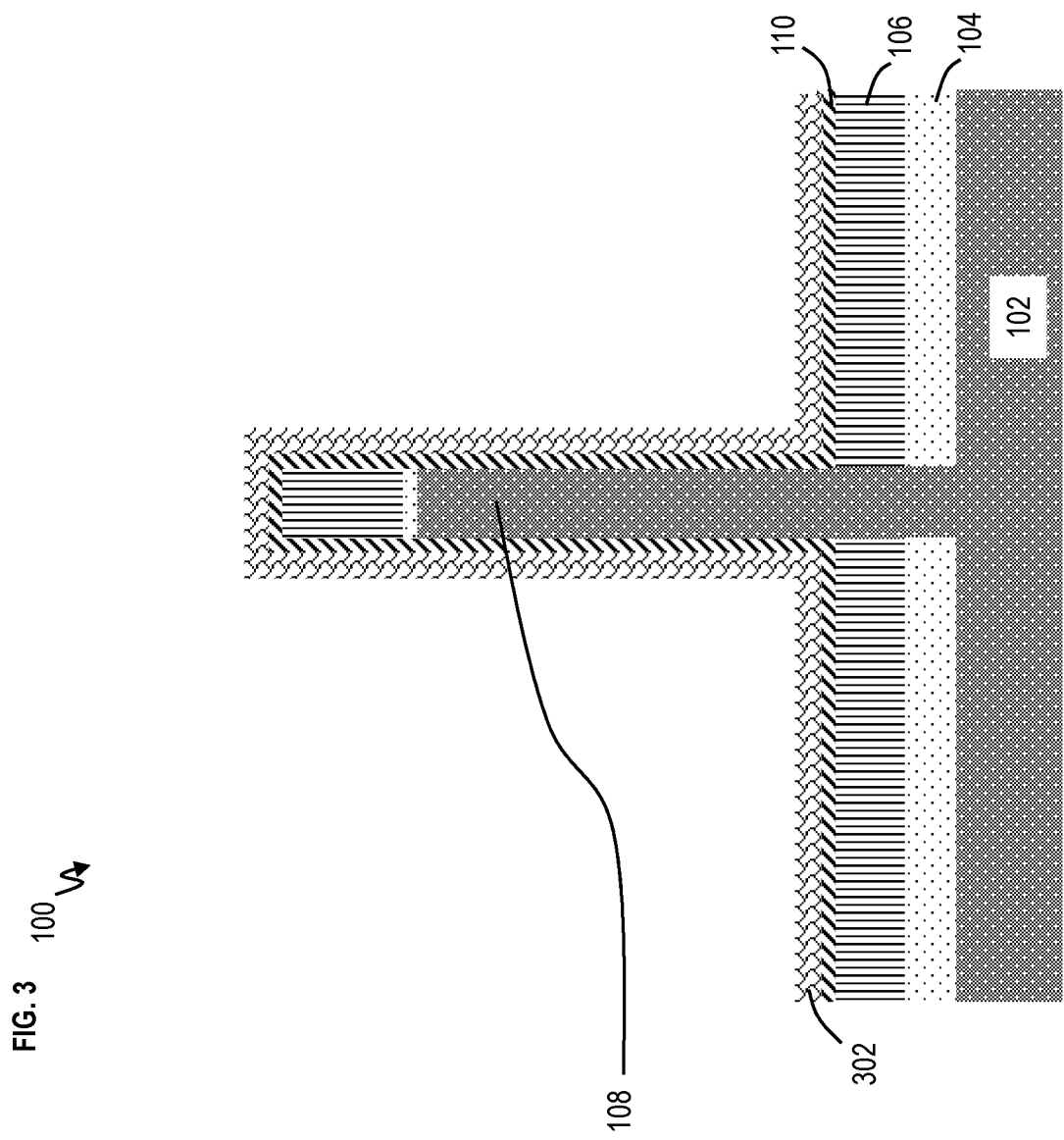
FIG. 3 depicts a cross-sectional view of the semiconductor device after fabrication operations according to embodiments of the invention.

FIG. 3 depicts a cross-sectional view of the semiconductor device 100 after fabrication operations according to embodiments of the invention. The reliability caps 202 and 204 can be removed. The reliability cap 202 can be removed by SC1 ($NH_4OH+H_2O_2$). The reliability cap 204 can be removed by $NH_4OH$ or TMAH (if silicon). In some implementations, the reliability cap 202 can remain. FIG. 3 illustrates deposition of one or more work function metals 302 on the high-k material 110. The one or more work function metals can be PFET work function metals for PFET devices and NFET work function metals for NFET devices. Example NFET work function metals can include TiN, TiC, TiAlN, etc. Example PFET work function metals can include TiN and others. The thickness of the one or more work function metals 302 can range from about 25 to 40 Å, and the one or more work function metals 302 can be deposited using atomic layer deposition (ALD).

Figure 4:
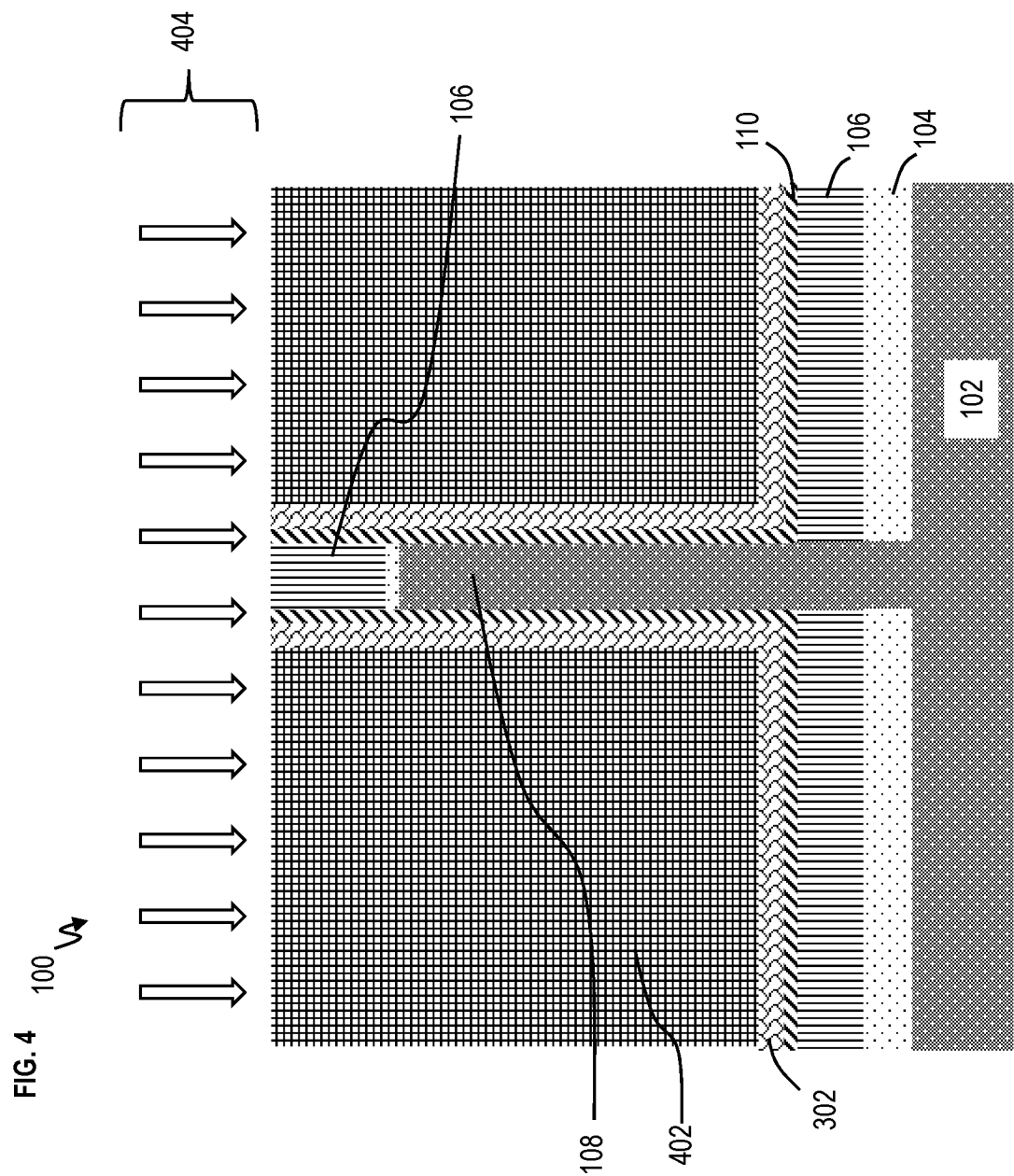
FIG. 4 depicts a cross-sectional view of the semiconductor device after fabrication operations according to embodiments of the invention.

FIG. 4 depicts a cross-sectional view of the semiconductor device 100 after fabrication operations according to embodiments of the invention. Gate material 402 is deposited and planarized to be flush with the material of the bottom spacer 106 on top of the fin 108 which can be referred to as the fin hard mask. The gate material 402 can be amorphous silicon and/or polysilicon. The gate material 402 can be doped during deposition. Additionally and/or alternatively, the gate material 402 can be doped via ion implantation depicted by arrows 404. The gate material 402 can be doped with p-type dopants or n-type dopants to form PFETs or NFETs, respectively. After doping (which can be by ion implantation and/or doping during deposition), thermal activation (e.g., thermal anneal) is performed to reduce the silicon gate resistance of the gate material 402.

Figure 5:
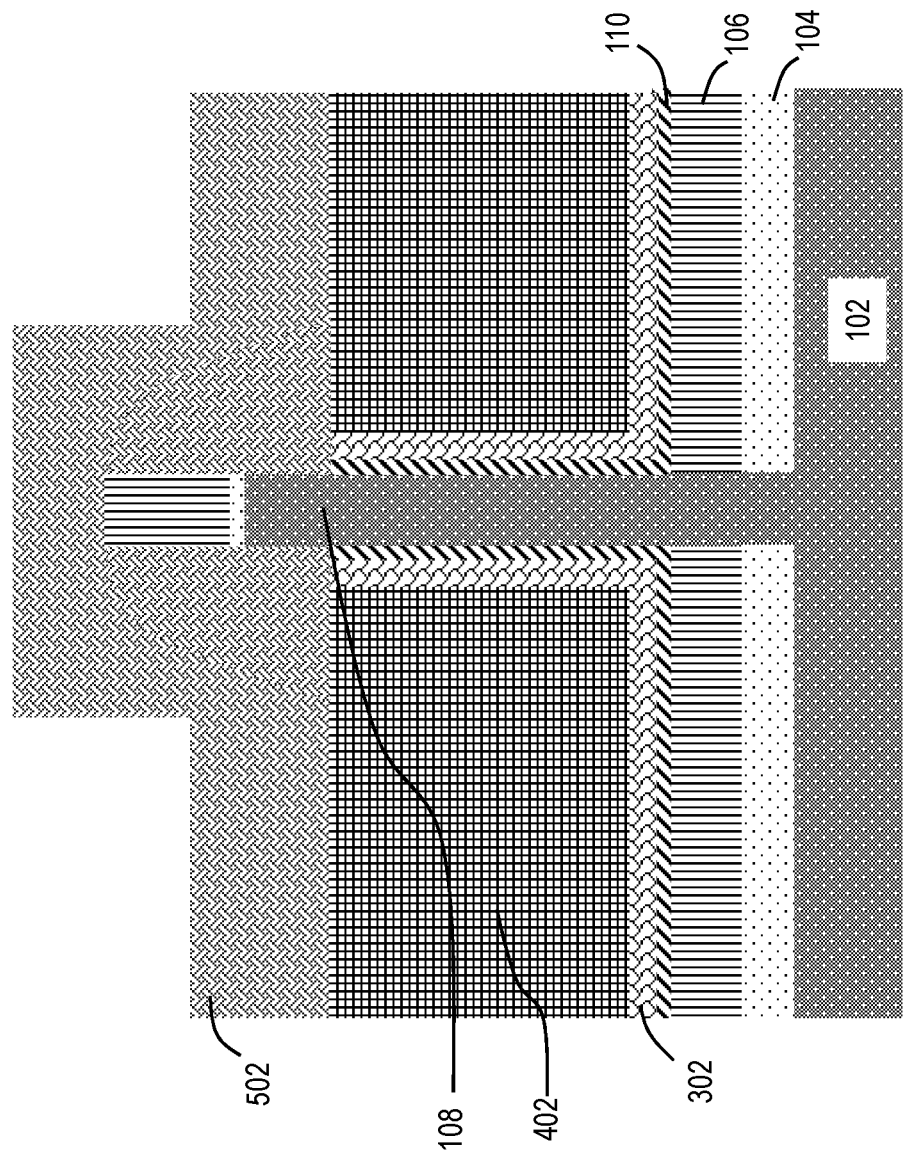
FIG. 5 depicts a cross-sectional view of the semiconductor device after fabrication operations according to embodiments of the invention.

FIG. 5 depicts a cross-sectional view of the semiconductor device 100 after fabrication operations according to embodiments of the invention. The gate material 402 is recessed, for example, using reactive ion etching (RIE) (a timed etch). In some cases, this etch does not pull down the high-k material 110 and the work function metals 302. Additionally, etching is performed to recess the high-k material 110 and the work function metals 302, and this etch can be a wet etch or a dry etch (e.g., RIE). After etching, the top portion of the fin 108 is exposed. A hard mask 502 is deposited on top of the semiconductor device 100. The hard mask 502 can a nitride-based material, such as silicon nitride.

Figure 6:
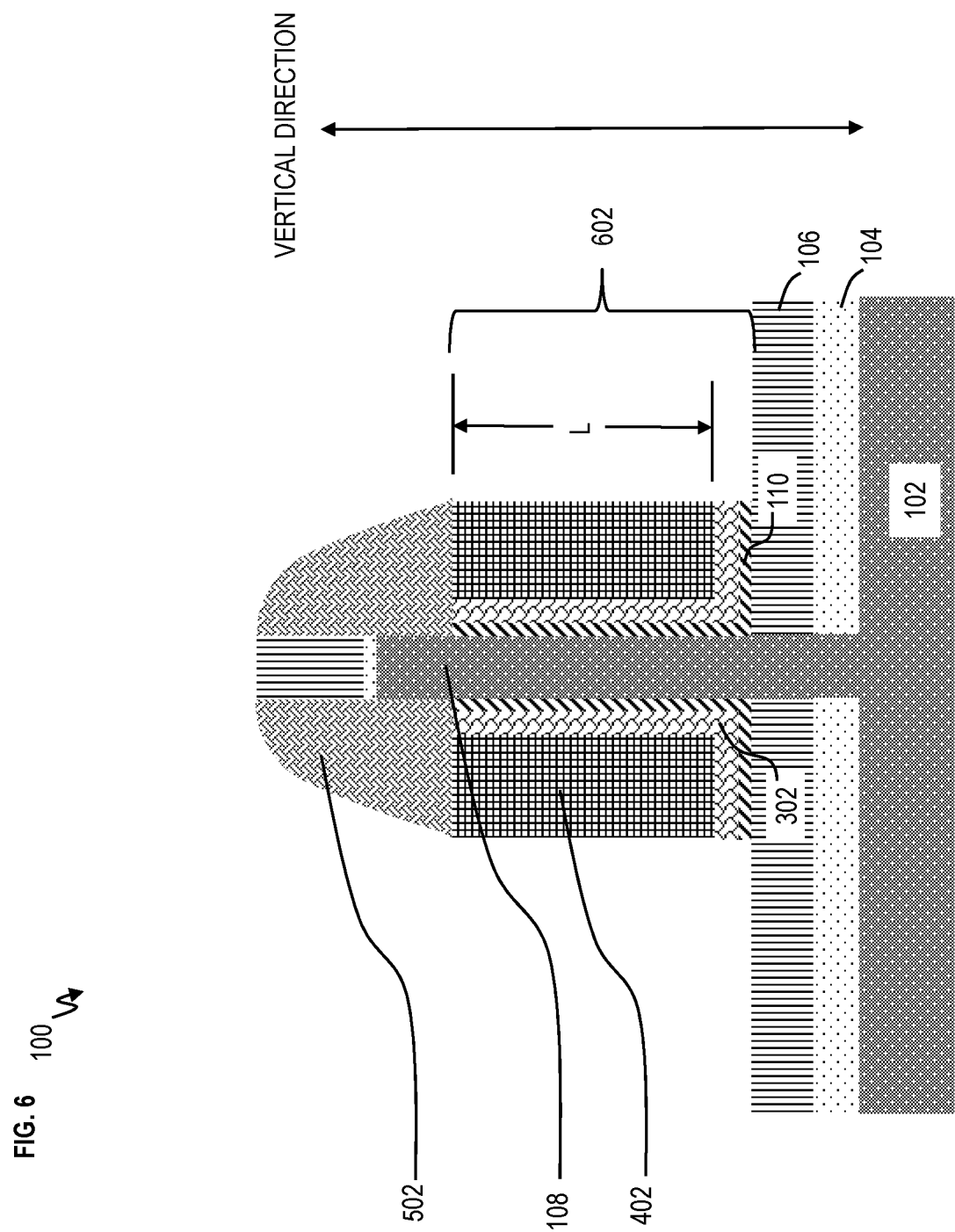
FIG. 6 depicts a cross-sectional view of the semiconductor device after fabrication operations according to embodiments of the invention.

FIG. 6 depicts a cross-sectional view of the semiconductor device 100 after fabrication operations according to embodiments of the invention. The hard mask 502 is etched. The hard mask 502 can be etched by anisotropic etch techniques such as reactive ion etching, and such etched hard mask 502 provides self-alignment for the gate stack 602. The etched hard mask 502 can then serve to protect the gate material 402, the work function metals 302, and the high-k material 110 for a subsequent etch, while leaving some portions unprotected or uncovered. The unprotected/uncovered portions of the gate material 402, work function metals 302, and high-k material 110 are etched using anisotropic etching methods such as reactive ion etching to stop on the work function metal and high-k dielectric in the field. The exposed work function metal and high-k films in the field are then etched by wet chemistry (SC1 followed by HF) or anisotropic dry etch chemistry that is selective to the bottom spacer material. The vertical gate length L of the vertical transistor is defined by the height of the gate material 402. The gate stack 602 includes gate material 402, work function metals 302, and high-k material 110. The gate stack 602 has a lateral dimension (i.e., width) that matches the width of the etched hard mask 502.

Figure 7:
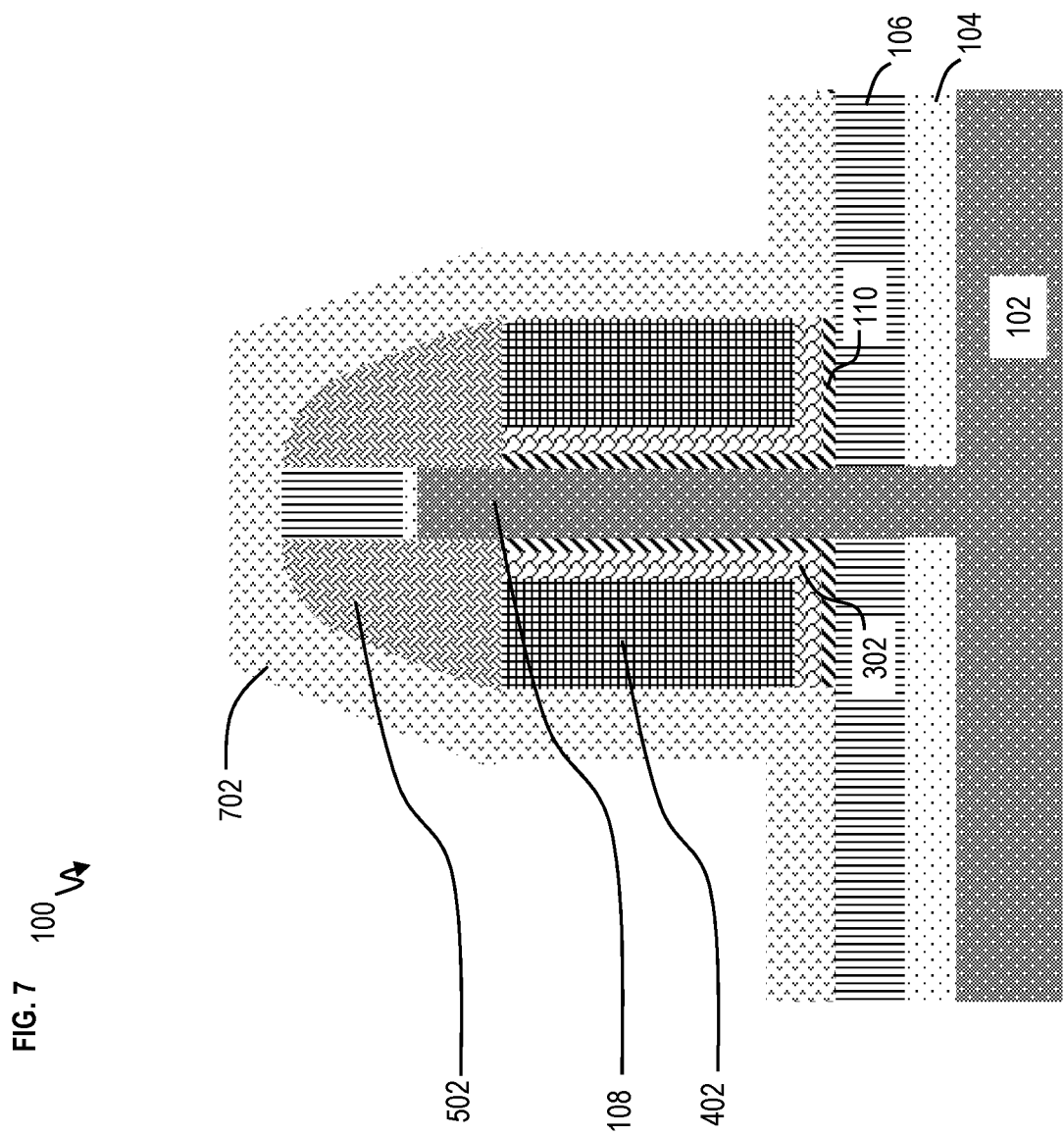
FIG. 7 depicts a cross-sectional view of the semiconductor device after fabrication operations according to embodiments of the invention.

FIG. 7 depicts a cross-sectional view of the semiconductor device 100 after fabrication operations according to embodiments of the invention. Metallization is performed. A metal 702 is deposited on the semiconductor device 100. Particularly, the metal 702 is formed directly on sides of the gate material 402, which is in preparation for silicide formation. The metal 702 can be a combination of materials. The metal 702 can be an NiPt layer. The metal 702 could be a combination of Ti and TiN layers. Other examples materials of the metal 702 can include Co or Mo.

Figure 8:
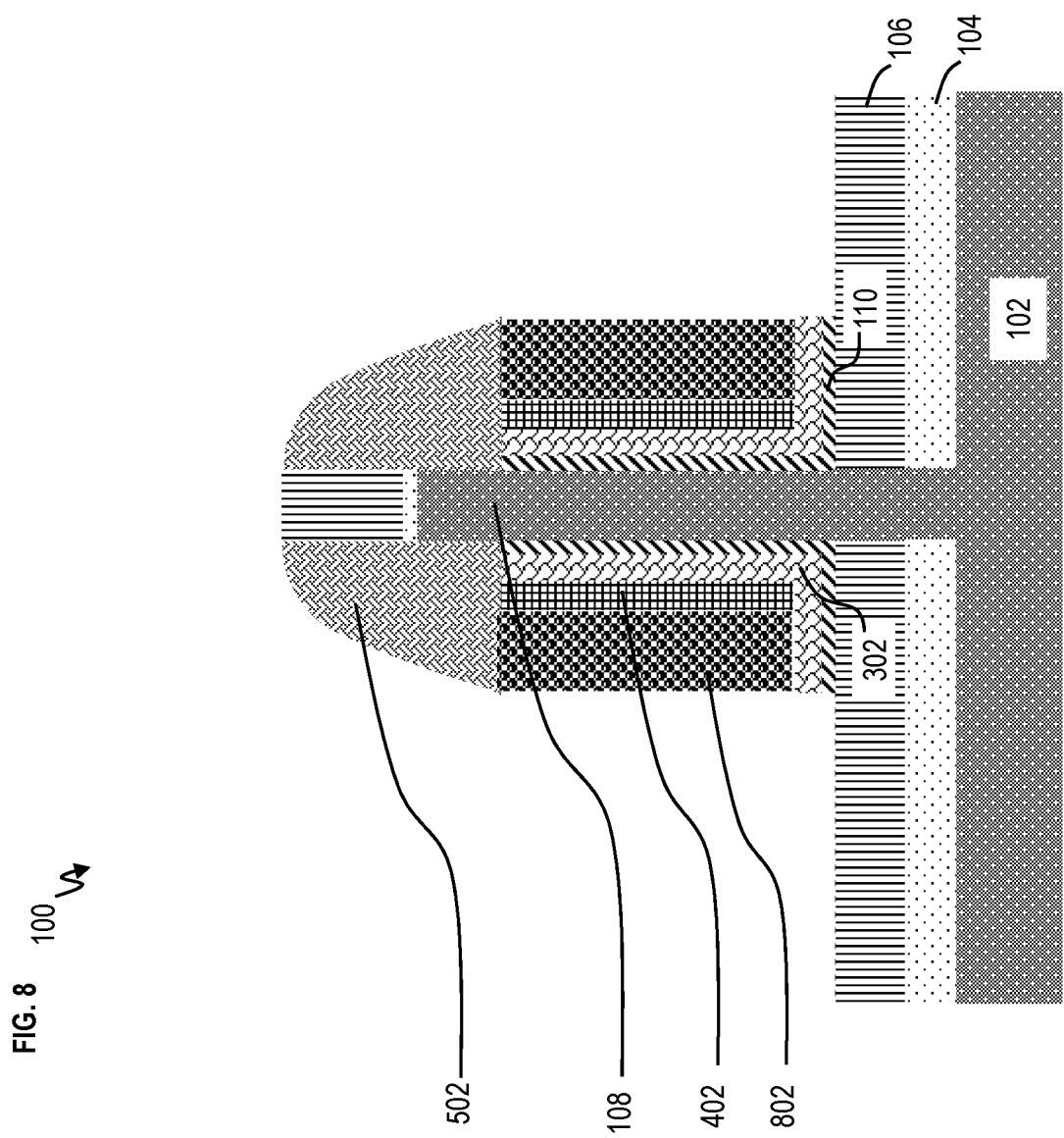
FIG. 8 depicts a cross-sectional view of the semiconductor device after fabrication operations according to embodiments of the invention.

FIG. 8 depicts a cross-sectional view of the semiconductor device 100 after fabrication operations according to embodiments of the invention. A silicide anneal is performed which transforms the gate material 402 at the interface with the metal 702 into a gate silicide layer 802. The interfacial reactions of the metal film with the silicon form the silicide layer 802. In some implementations, a rapid thermal anneal can be performed in the range of about 700-800° C. The unreacted metal 702 can be removed by a wet etch, thus leaving the silicide layer 802 and the gate material 402 under the hard mask 502. Some of the gate material 402 remains and is unreacted.

Figure 9:
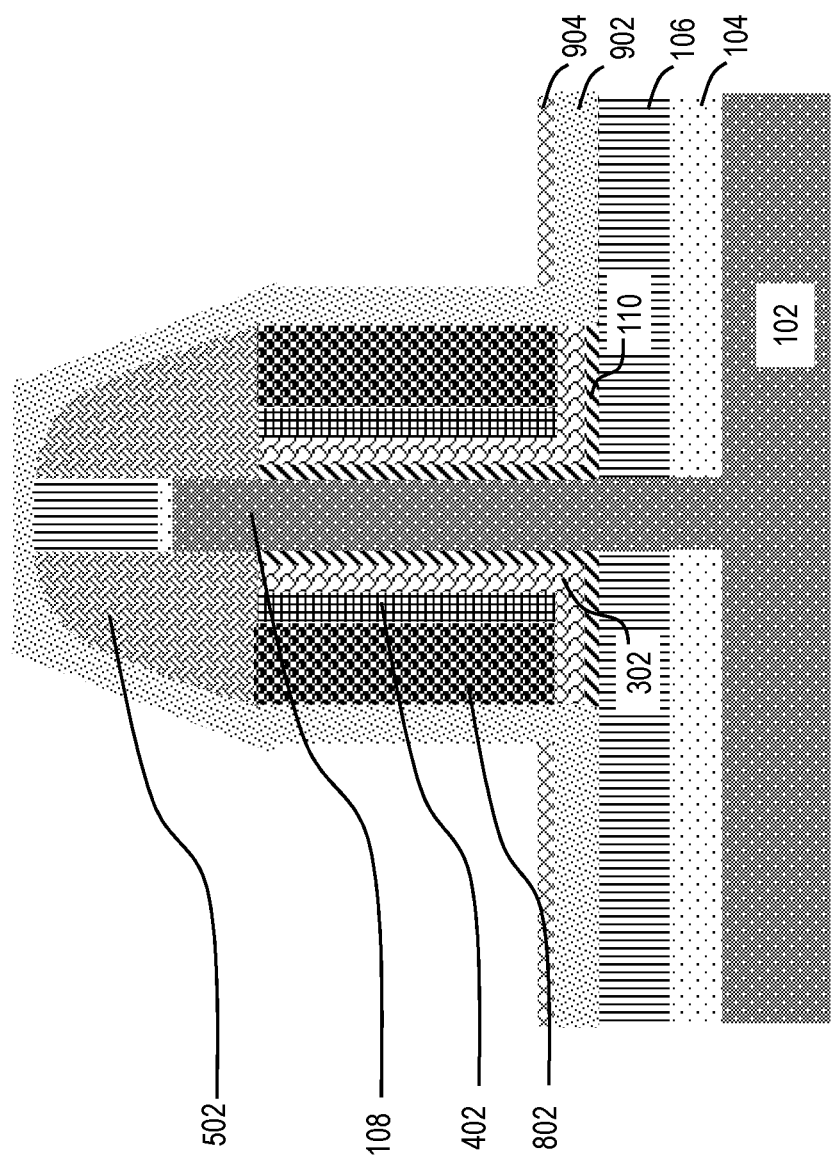
FIG. 9 depicts a cross-sectional view of the semiconductor device after fabrication operations according to embodiments of the invention.

FIG. 9 depicts a cross-sectional view of the semiconductor device 100 after fabrication operations according to embodiments of the invention. Nitride deposition is performed. For example, a nitride-based material 902 is deposited on the semiconductor device 100. The nitride material 902 can be aluminum nitride or silicon nitride. A dielectric film 904 is formed on top of a horizontal surface of the nitride material 902. Example materials of the dielectric film 904 can include aluminum oxide, etc. The dielectric film 904 can be grown from bottom up. The bottom up deposition of ALD $Al_2O_3$ for dielectric film 904 can be achieved by selective surface activation or modification of SiN in the field while keeping the sidewalls SiN unreactive (by such methods as directional ion or electron bombardment) such that there is a preferential nucleation of ALD $Al_2O_3$ in the field, and a finite delay in the nucleation time between the field and sidewall.

Figure 10:
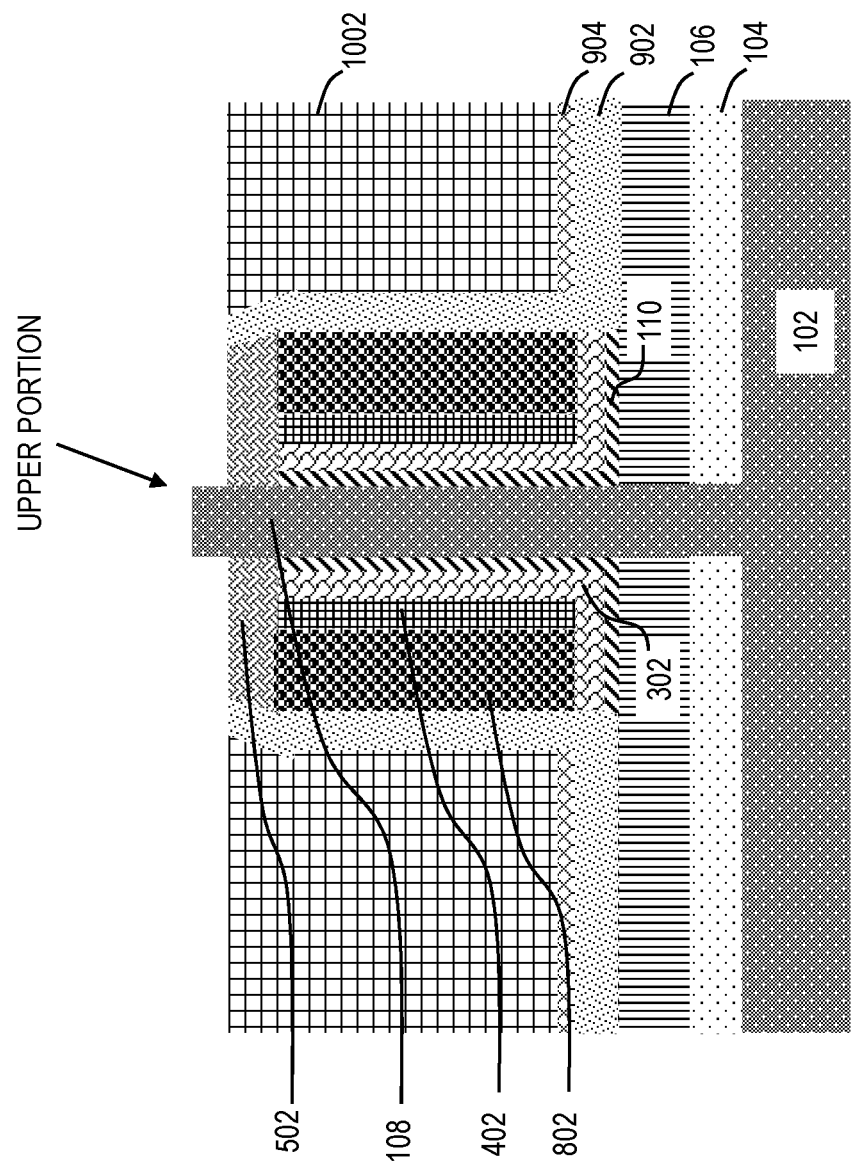
FIG. 10 depicts a cross-sectional view of the semiconductor device after fabrication operations according to embodiments of the invention.

FIG. 10 depicts a cross-sectional view of the semiconductor device 100 after fabrication operations according to embodiments of the invention. An oxide fill is performed to deposit oxide material 1002. Examples of the oxide material 1002 can be silicon oxide, etc. Chemical mechanical polishing/planarization (CMP) of the oxide material 1002 is performed to stop on top of the nitride material 902. Subsequently or additionally, etching is performed to recess the oxide material 1002, nitride material 902, and hard mask 502 below the fin 108 (non-selective oxide/nitride etch which is selective to Si fin), while both the bottom plate 104 and bottom spacer 106 on top of the fin 108 are removed. FIG. 10 shows that the upper portion of the fin 108 is exposed.

Figure 11:
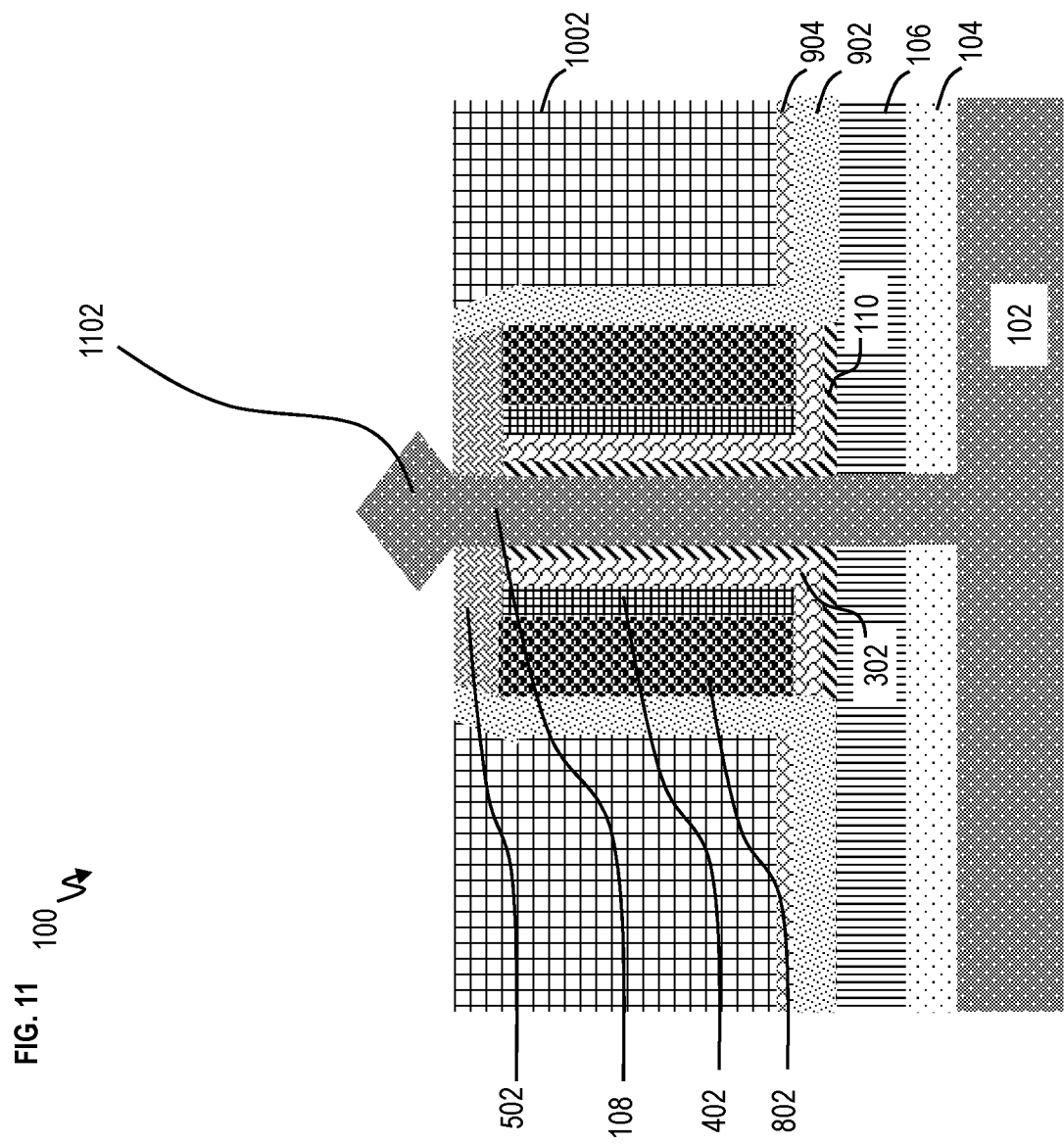
FIG. 11 depicts a cross-sectional view of the semiconductor device after fabrication operations according to embodiments of the invention.

FIG. 11 depicts a cross-sectional view of the semiconductor device 100 after fabrication operations according to embodiments of the invention. Top S/D material 1102 is epitaxially grown from the upper portion of the fin 108. The top S/D material 1102 is doped with p-type dopants for PFETs and doped with n-type dopants for NFETs. The top S/D material 1102 can be a silicon material.

Figure 12:
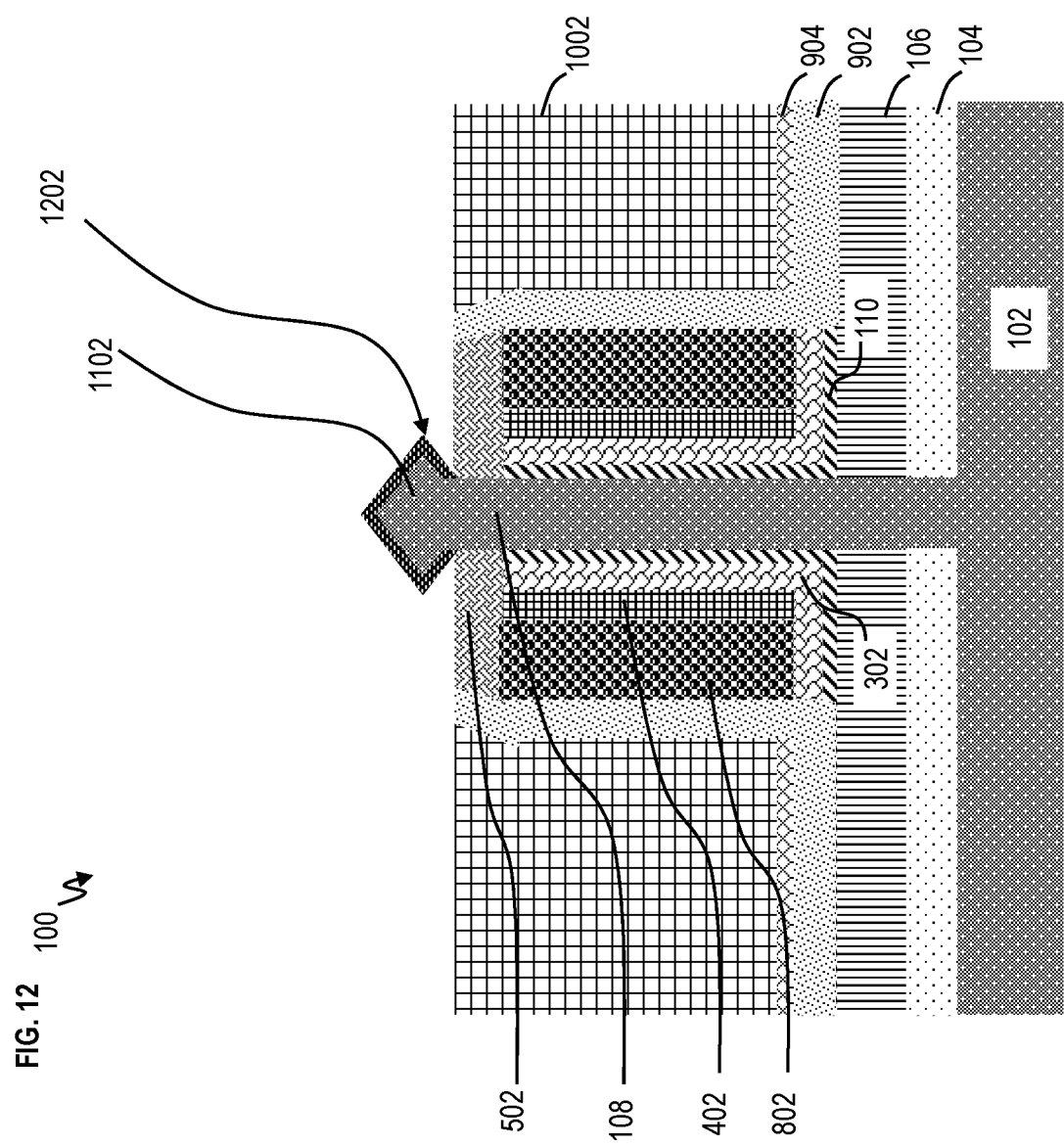
FIG. 12 depicts a cross-sectional view of the semiconductor device after fabrication operations according to embodiments of the invention.

FIG. 12 depicts a cross-sectional view of the semiconductor device 100 after fabrication operations according to embodiments of the invention. Top S/D silicide material 1202 is formed on the top S/D material 1102. The silicide layer 1202 can be formed analogously to FIGS. 7 and 8. For example, a metal layer (not shown) is formed on the top S/D material 1102. A silicide anneal is performed which transforms the top S/D material 1102 at the interface with the metal (analogous metal 702 in FIG. 7) into the silicide layer 1202. The metal is removed leaving the silicide layer 1202.

Figure 13:
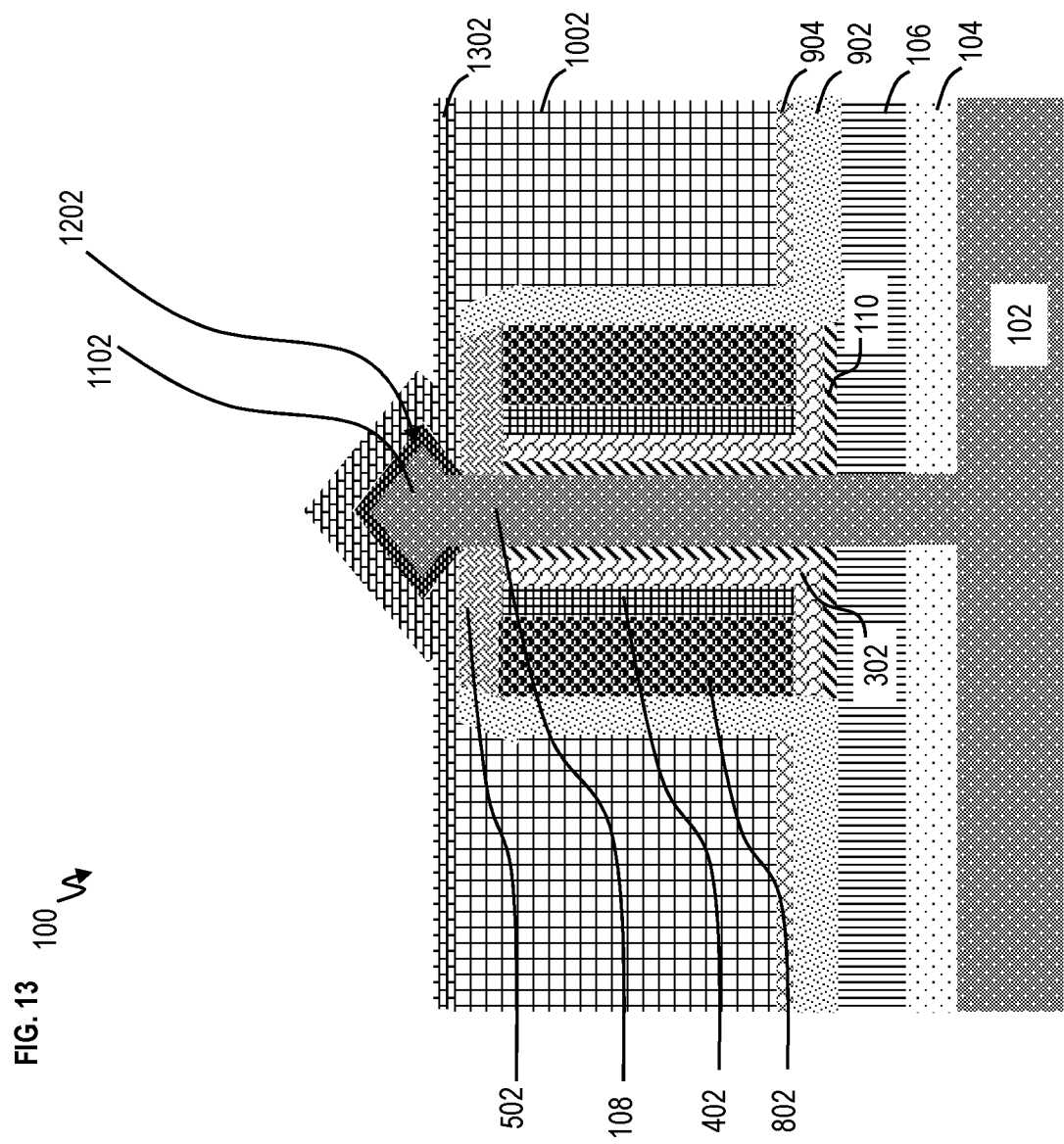
FIG. 13 depicts a cross-sectional view of the semiconductor device after fabrication operations according to embodiments of the invention.
Figure 14:
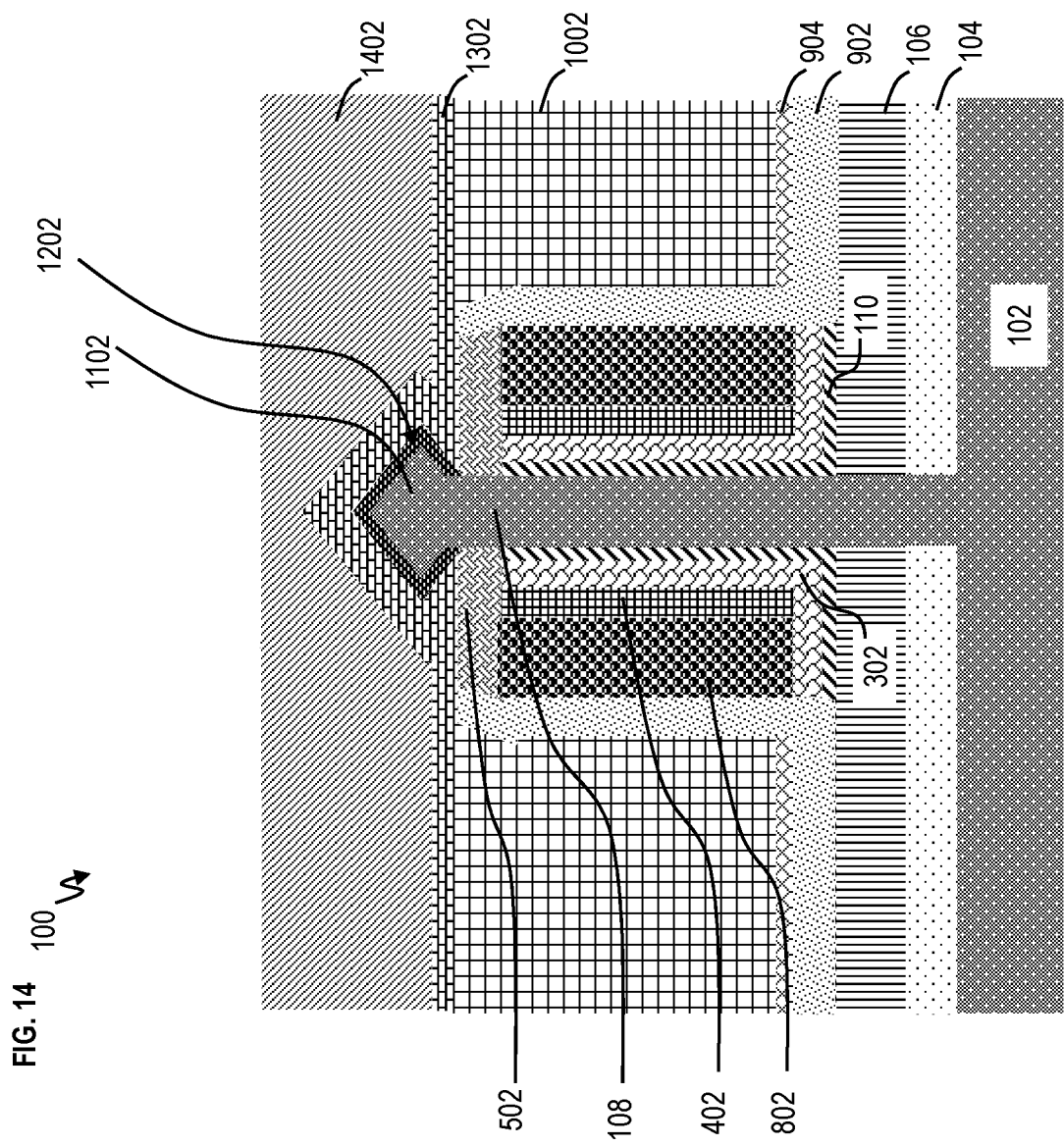
FIG. 14 depicts a cross-sectional view of the semiconductor device after fabrication operations according to embodiments of the invention.

FIG. 13 depicts a cross-sectional view of the semiconductor device 100 after fabrication operations according to embodiments of the invention. A protecting nitride deposition is performed. For example, a nitride-based material 1302 is formed on the silicide layer 1202. The nitride material 1302 can be silicon nitride. FIG. 14 depicts a cross-sectional view of the semiconductor device 100 after fabrication operations according to embodiments of the invention. Oxide material 1402 is deposited on top of the semiconductor device 100. The oxide material 1402 can be silicon dioxide, etc.

Figure 15:
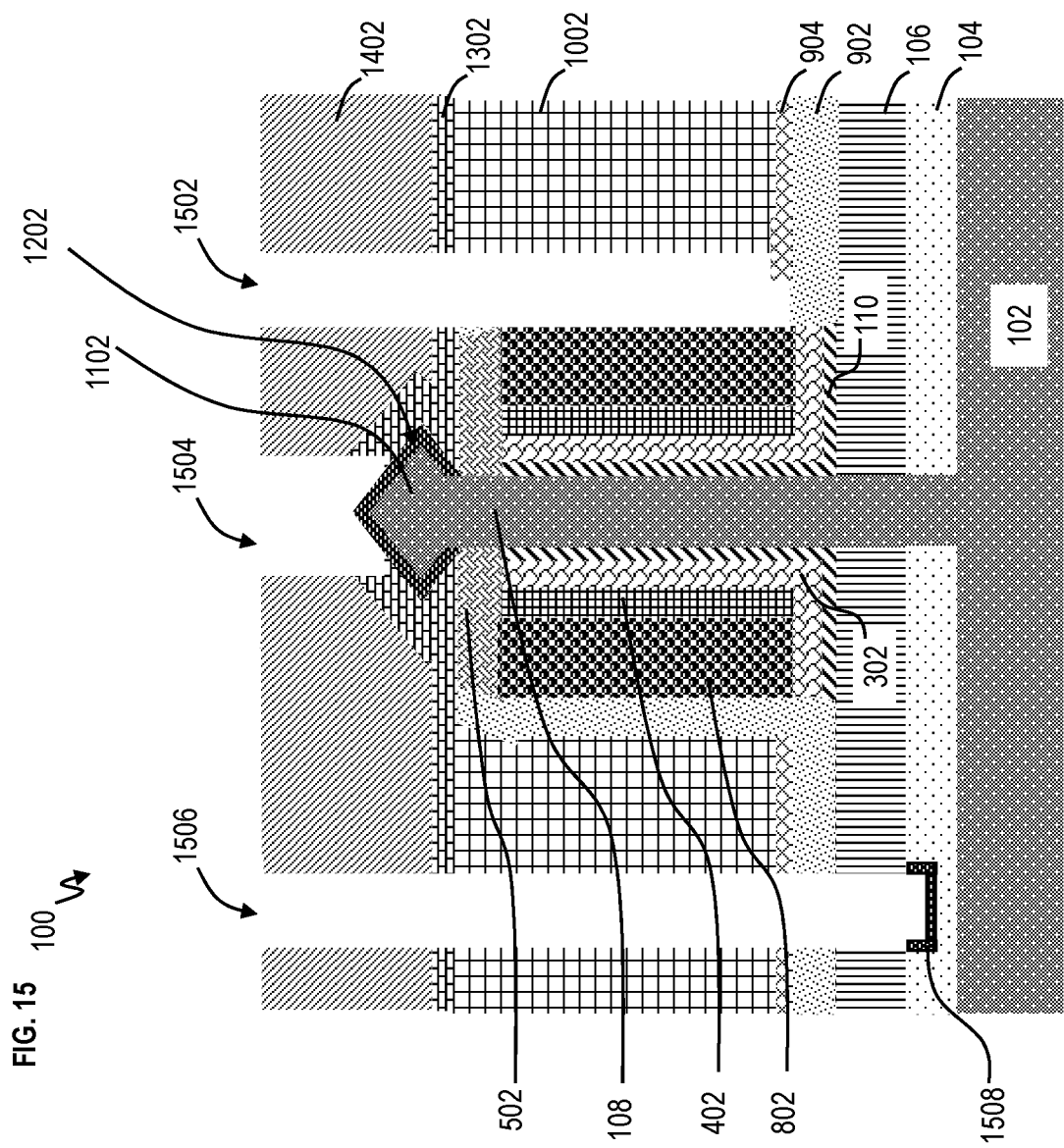
FIG. 15 depicts a cross-sectional view of the semiconductor device after fabrication operations according to embodiments of the invention.

FIG. 15 depicts a cross-sectional view of the semiconductor device 100 after fabrication operations according to embodiments of the invention. One or more contact openings can be formed. A gate contact opening 1502 can be formed through the oxide material 1402, the nitride material 1302, oxide material 1002, and nitride material 902 such that a side portion of the silicide layer 802 is exposed in the gate contact opening 1502 in preparation for metallization. The gate contact opening 1502 is formed by non-selective ($SiO_2$/SiN) RIE all the way down to stop on $Al_2O_3$. The small sliver of oxide along the silicided sidewall is removed using a very dilute HF chemistry which would keep the bottom $Al_2O_3$ layer unetched. In some implementations, an organic planarization layer (OPL) (not shown) and/or photoresist layer can be deposited to protect the areas of the semiconductor device 100 where the gate contact opening 1502 is not formed. Metallization of the gate contact opening 1502 can be performed to form gate contact 1602 depicted in FIG. 16. Alternatively and/or additionally, other contact openings can be formed prior to metallization of the gate contact 1602. A top S/D contact opening 1504 is formed through the oxide material 1402 and the nitride material 1302 so as to expose a portion of the silicide layer 1202, while the OPL layer (and/or photoresist layer) protects other areas of the semiconductor device 100 (including the previously opened gate contact opening 1502). Also, a bottom S/D contact opening 1506 can be formed the through the oxide material 1402, nitride material 1302, oxide material 1002, dielectric film 904, nitride material 902, and bottom spacer 106 so as to expose the bottom plate 104. Some over etch can occur to etch a portion of the bottom plate 104. A bottom S/D silicide layer 1508 can be formed on the bottom plate 104 as discussed herein for FIGS. 7, 8, and 12. The silicide layer 1508 can be formed by depositing a metal in the bottom S/D contact opening 1506, performing silicide anneal, and removing the metal, while the OPL layer (and/or photoresist layer) protects other areas of the semiconductor device 100. As noted above, the bottom plate 104 is the bottom S/D region. The OPL layer and/or photoresist layer are removed in preparation for metallization.

Figure 16:
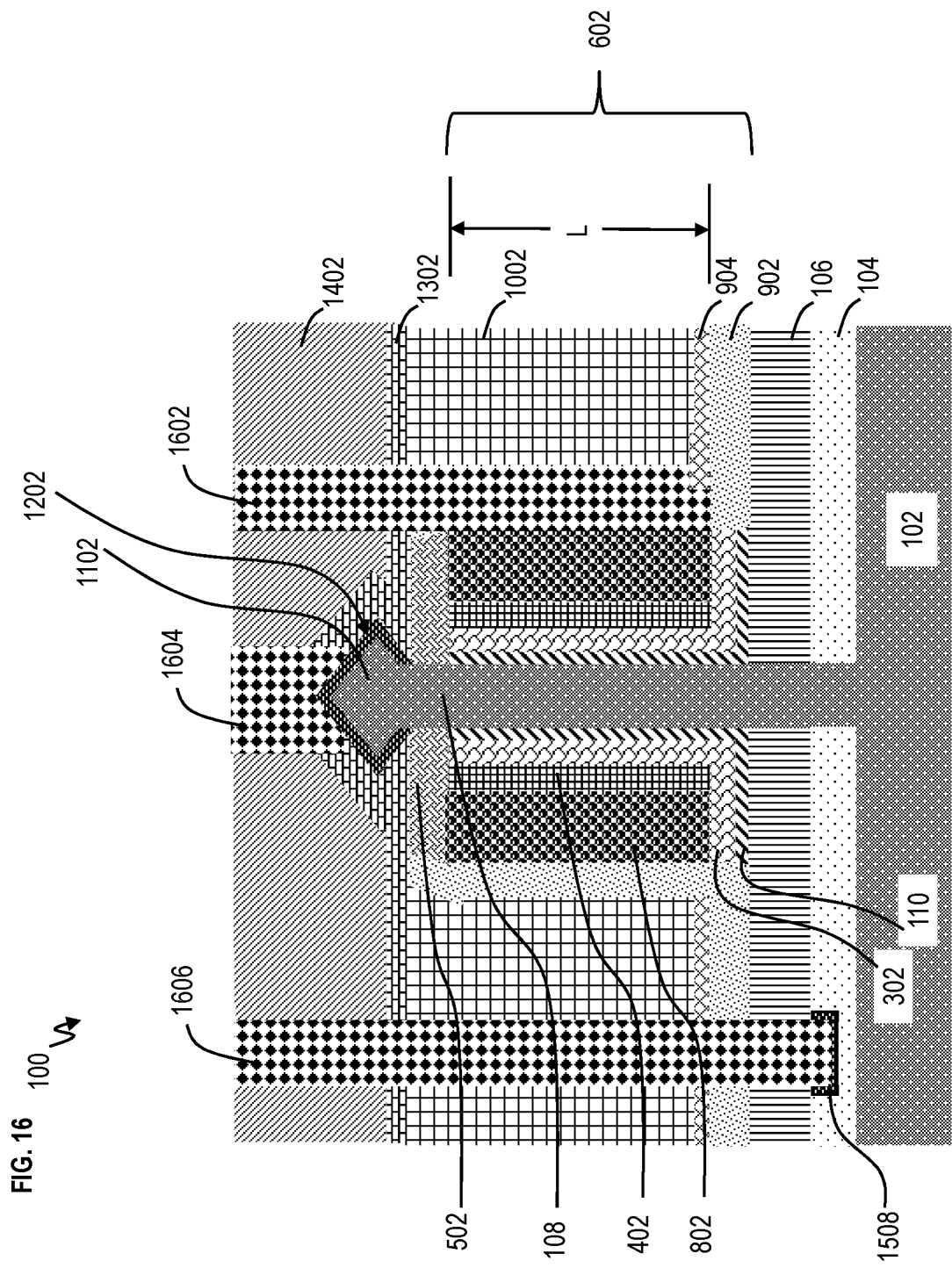
FIG. 16 depicts a cross-sectional view of the semiconductor device after fabrication operations according to embodiments of the invention.

FIG. 16 depicts a cross-sectional view of the semiconductor device 100 after fabrication operations according to embodiments of the invention. Metallization is performed to create the gate contact 1602, top S/D contact 1604, and bottom S/D contact 1606. The material of the gate contact 1602, top S/D contact 1604, and bottom S/D contact 1606 can be titanium nitride, tungsten, etc. The contact resistance between the gate contact 1602 and the gate stack 602 is reduced because the gate contact 1602 extends the (vertical) length L of the gate silicide layer 802 and because of the full silicidation for the length of the gate material 402.

A method of forming a semiconductor device 100 is provided. The method includes forming gate stack 602 on a fin 108, the gate stack 602 being formed to have a length L in a vertical direction, forming a gate contact 1602 adjacent to the gate stack 602 for the length of the gate stack 602 in the vertical direction.

The gate stack 602 includes a silicide layer 802. A silicide layer 802 of the gate stack extends the length L of the gate stack 602. A silicide layer 802 of the gate stack 602 is coupled to the gate contact 1602 for the length of the gate stack 602. The gate stack 602 includes a high-k dielectric material 110, one or more work function metals 302, a gate material 402, and a silicide layer 802. The gate material 402 includes polysilicon, amorphous silicon, etc. The silicide layer 802 wraps around the high-k dielectric material 110, the one or more work function metals 302, and the gate material 402. A top source or drain (S/D) region 1102 is formed on an upper portion of the fin 108. A bottom S/D region 104 is formed on a lower portion of the fin 108.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor device, the method comprising:
   forming a gate stack on a fin, the gate stack being formed to have a vertical gate length in a vertical direction; and
   forming a gate contact adjacent to the gate stack and corresponding to the vertical gate length of the gate stack in the vertical direction.

2. The method of claim 1, wherein the gate stack comprises a silicide layer.

3. The method of claim 1, wherein a silicide layer of the gate stack extends the vertical gate length of the gate stack.

4. The method of claim 1, wherein a silicide layer of the gate stack is coupled to the gate contact for the vertical gate length of the gate stack.

5. The method of claim 1, wherein the gate stack comprises a high-k dielectric material, one or more work function metals, a gate material, and a silicide layer.

6. The method of claim 5, wherein the gate material comprises polysilicon.

7. The method of claim 5, wherein the gate material comprises amorphous silicon.

8. The method of claim 5, wherein the silicide layer wraps around the high-k dielectric material, the one or more work function metals, and the gate material.

9. The method of claim 1, wherein a top source or drain (S/D) region is formed on an upper portion of the fin.

10. The method of claim 1, wherein a bottom S/D region is formed on a lower portion of the fin.

11. A semiconductor device comprising:
   a gate stack formed on a fin, the gate stack being formed to have a vertical length in a vertical direction; and
   a gate contact formed adjacent to the gate stack and corresponding to the vertical gate length of the gate stack in the vertical direction.

12. The semiconductor device of claim 11, wherein the gate stack comprises a silicide layer.

13. The semiconductor device of claim 11, wherein a silicide layer of the gate stack extends the vertical gate length of the gate stack.

14. The semiconductor device of claim 11, wherein a silicide layer of the gate stack is coupled to the gate contact for the vertical gate length of the gate stack.

15. The semiconductor device of claim 11, wherein the gate stack comprises a high-k dielectric material, one or more work function metals, a gate material, and a silicide layer.

16. The semiconductor device of claim 15, wherein the gate material comprises polysilicon.

17. The semiconductor device of claim 15, wherein the gate material comprises amorphous silicon.

18. The semiconductor device of claim 15, wherein the silicide layer wraps around the high-k dielectric material, the one or more work function metals, and the gate material.

19. The semiconductor device of claim 11, wherein a top source or drain (S/D) region is formed on an upper portion of the fin.

20. The semiconductor device of claim 11, wherein a bottom S/D region is formed on a lower portion of the fin.

* * * * *